United States Patent
Kobayashi et al.

(10) Patent No.: US 7,981,718 B2
(45) Date of Patent: Jul. 19, 2011

(54) METHOD OF MANUFACTURING SOLID-STATE IMAGE PICKUP ELEMENT, AND SOLID-STATE IMAGE PICKUP ELEMENT

(75) Inventors: Hideki Kobayashi, Nagasaki (JP); Masafumi Muramatsu, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/364,254

(22) Filed: Feb. 2, 2009

(65) Prior Publication Data

US 2009/0212384 A1 Aug. 27, 2009

(30) Foreign Application Priority Data

Feb. 22, 2008 (JP) ................. 2008-040969

(51) Int. Cl.
*H01L 21/58* (2006.01)
(52) U.S. Cl. .... 438/67; 438/118; 438/455; 257/E21.499
(58) Field of Classification Search ............ 257/E21.499
See application file for complete search history.

(56) References Cited

U.S. PATENT DOCUMENTS

| 6,169,319 | B1 * | 1/2001 | Malinovich et al. | 257/447 |
| 6,809,008 | B1 * | 10/2004 | Holm et al. | 438/455 |
| 7,276,394 | B2 * | 10/2007 | Waldman et al. | 438/64 |
| 2004/0233503 | A1 * | 11/2004 | Kimura | 359/275 |
| 2005/0104148 | A1 * | 5/2005 | Yamamoto et al. | 257/432 |
| 2008/0280398 | A1 * | 11/2008 | Haluzak et al. | 438/115 |

FOREIGN PATENT DOCUMENTS

| JP | 05-291217 | 11/1993 |
| JP | 10-135386 | 5/1998 |
| JP | 2005-285988 | 10/2005 |

* cited by examiner

*Primary Examiner* — Stephen W Smoot
(74) *Attorney, Agent, or Firm* — Robert J. Depke; Rockey, Depke & Lyons, LLC

(57) ABSTRACT

Disclosed herein is a method of manufacturing a solid-state image pickup element, the method including the steps of forming a plurality of photoelectric conversion elements within a semiconductor substrate; forming a wiring layer via an insulating film on a surface of the semiconductor substrate in which surface the plurality of photoelectric conversion elements are formed; laminating a supporting substrate to a surface of the semiconductor substrate in which surface the wiring layer is formed via an adhesive; applying a pressure to the semiconductor substrate and the supporting substrate in a state of the semiconductor substrate and the supporting substrate being laminated to each other via the adhesive; and curing the adhesive by heating the adhesive to a curing temperature of the adhesive after releasing the applied pressure.

3 Claims, 4 Drawing Sheets

FIG. 4

| No. | TEMPORARY BONDING PRESSURE (N) | TEMPORARY BONDING TEMPERATURE (°C) | HEATING ATMOSPHERE | DISTORTION DATA X,Y (%) | FLATNESS LTV (μm) |
|---|---|---|---|---|---|
| 1 | 1000 | 50 | NITROGEN | 28,36 | 0.8 |
| 2 | 3000 | 50 | NITROGEN | 43,51 | 0.7 |
| 3 | 5000 | 50 | NITROGEN | 39,37 | 0.8 |
| ref | 3000 | — | VACUUM | 100,100 | 1.5 |

US 7,981,718 B2

METHOD OF MANUFACTURING SOLID-STATE IMAGE PICKUP ELEMENT, AND SOLID-STATE IMAGE PICKUP ELEMENT

CROSS REFERENCES TO RELATED APPLICATIONS

The present invention contains subject matter related to Japanese Patent Application JP 2008-040969 filed in the Japan Patent Office on Feb. 22, 2008, the entire contents of which being incorporated herein by reference.

BACKGROUND OF THE INVENTION

1. Field of the Invention

The present invention relates to a method of manufacturing a solid-state image pickup element having a plurality of photoelectric conversion elements formed within a semiconductor substrate, and the solid-state image pickup element.

2. Description of the Related Art

The development of a so-called back-surface irradiation type CMOS (Complementary Metal Oxide Semiconductor) sensor with an objective of maximizing an aperture area of a photodiode (FD) has recently been under way. Specifically, first, for example a φ8-inch SOI (Silicon On Insulator) substrate (device substrate) in which a CMOS image sensor is formed is laminated to a silicon (Si) substrate (supporting substrate) of a same size as the SOI substrate. The side of the SOI substrate is ground and etched, and merely a Si active layer is left in the SOI substrate (back surface transfer).

Then, a color filter (OCCF) and an on-chip lens (OCL) are formed on the transferred active layer, thereby a back-surface irradiation type CMOS sensor is completed, which ultimately has a photodiode (FD) located in an upper surface and a wiring layer located in a lower surface.

As a method of manufacturing the above-described solid-state image pickup element, the inventor of the present application et al. have disclosed a substrate laminating method using benzocyclobutene (BCB) as a thermosetting adhesive for laminating the device substrate and the supporting substrate to each other (Japanese Patent Laid-Open No. 2005-285988). A concrete lamination is performed under the following conditions.

A device substrate (wafer) on which an adhesive layer is formed and a supporting substrate (wafer) are superimposed on each other in a decompressed atmosphere, and are then heated to a curing temperature (200° C. to 350° C.) of the adhesive to be laminated to each other while a pressure is applied to both the wafers. This laminating method has an advantage of being able to perform curing at a temperature lower than a degrading temperature of 450° C. of a wiring layer made of a material having a low heat resistance (for example Al or Cu) formed on the wafer.

Other wafer laminating methods using an adhesive include techniques disclosed in Japanese Patent Laid-Open Nos. Hei 5-291217 and Hei 10-135386. Japanese Patent Laid-Open No. Hei 5-291217 discloses techniques that use a thermoplastic resin for wafer lamination and which perform the lamination after lowering the viscosity of the resin by heating. Japanese Patent Laid-Open No. Hei 10-135386 discloses techniques that laminate a wafer and a radiation plate to each other using an adhesive and then separate the wafer into individual chips.

SUMMARY OF THE INVENTION

A manufacturing process that performs substrate lamination as described above needs to form the color filter (OCCF) and the on-chip lens (OCL) at accurate positions with respect to the photodiode (FD) in the back-surface-transferred silicon active layer. Thus, when a displacement occurs between the photodiode (FD), the color filter (OCCF), and the on-chip lens (OCL), light to be made incident on an adjacent pixel is taken in by the photodiode (FD) to cause a color mixture, or a light condensing focal position is shifted to cause shading, so that the performance of the solid-state image pickup element is degraded.

This displacement between the photodiode (FD), the color filter (OCCF), and the on-chip lens (OCL) is caused by distortion occurring in the silicon active layer at the time of lamination. The position of the photodiode (FD) is shifted in the distorted wafer. Therefore, when the color filter (OCCF) and the on-chip lens (OCL) are formed at ideal positions, a displacement consequently occurs between the photodiode (FD), the color filter (OCCF), and the on-chip lens (OCL).

The embodiment of the present invention has been made to solve such problems. Specifically, an embodiment of the present invention is a method of manufacturing a solid-state image pickup element, the method including the steps of forming a plurality of photoelectric conversion elements within a semiconductor substrate; forming a wiring layer via an insulating film on a surface of the semiconductor substrate in which surface the plurality of photoelectric conversion elements are formed; laminating a supporting substrate to a surface of the semiconductor substrate in which surface the wiring layer is formed via an adhesive; applying a pressure to the semiconductor substrate and the supporting substrate in a state of the semiconductor substrate and the supporting substrate being laminated to each other via the adhesive; and curing the adhesive by heating the adhesive to a curing temperature of the adhesive after releasing the applied pressure.

Another embodiment of the present invention is a solid-state image pickup element including a plurality of photoelectric conversion elements formed within a semiconductor substrate; a wiring layer formed via an insulating film on a surface of the semiconductor substrate in which surface the plurality of photoelectric conversion elements are formed; and a supporting substrate laminated to a surface of the semiconductor substrate in which surface the wiring layer is formed via an adhesive; wherein a pressure is applied to the semiconductor substrate and the supporting substrate in a state of the semiconductor substrate and the supporting substrate being laminated to each other via the adhesive, and the adhesive is cured after the applied pressure is released.

That is, in the embodiment of the present invention, a process of laminating the semiconductor substrate and the supporting substrate is performed in two divided stages of temporary bonding performed in the vicinity of a room temperature under reduced pressure and main curing that cures the adhesive by heating without applying pressure.

For example, a pressure is first applied to a wafer (a semiconductor substrate or a supporting substrate) coated with BCB as an adhesive and another wafer (the supporting substrate or the semiconductor substrate) at a temperature in a range of a room temperature to a reflow temperature of BCB to make the wafers closely adhere to each other, and thereby perform the temporary bonding. The temporary bonding performed in a state before the curing of BCB at or below the reflow temperature can minimize effect of stress at the time of curing the adhesive. The reflow temperature in this case refers to a temperature before BCB is cured by heat.

Thus, according to the embodiment of the present invention, it is possible to suppress pattern distortion at the time of lamination as compared with the existing method that laminates a semiconductor substrate and a supporting substrate to each other via an adhesive and which cures the adhesive by heating while applying pressure to the semiconductor substrate and the supporting substrate.

BRIEF DESCRIPTION OF THE DRAWINGS

FIG. 4 is a diagram showing a result of substrate laminating conditions according to the present embodiment, distortion, and flatness (LTV).

DETAILED DESCRIPTION OF THE PREFERRED EMBODIMENT

An embodiment of the present invention will hereinafter be described with reference to the drawings.
<Solid-State Image Pickup Element According to Present Embodiment>

Figure 1:
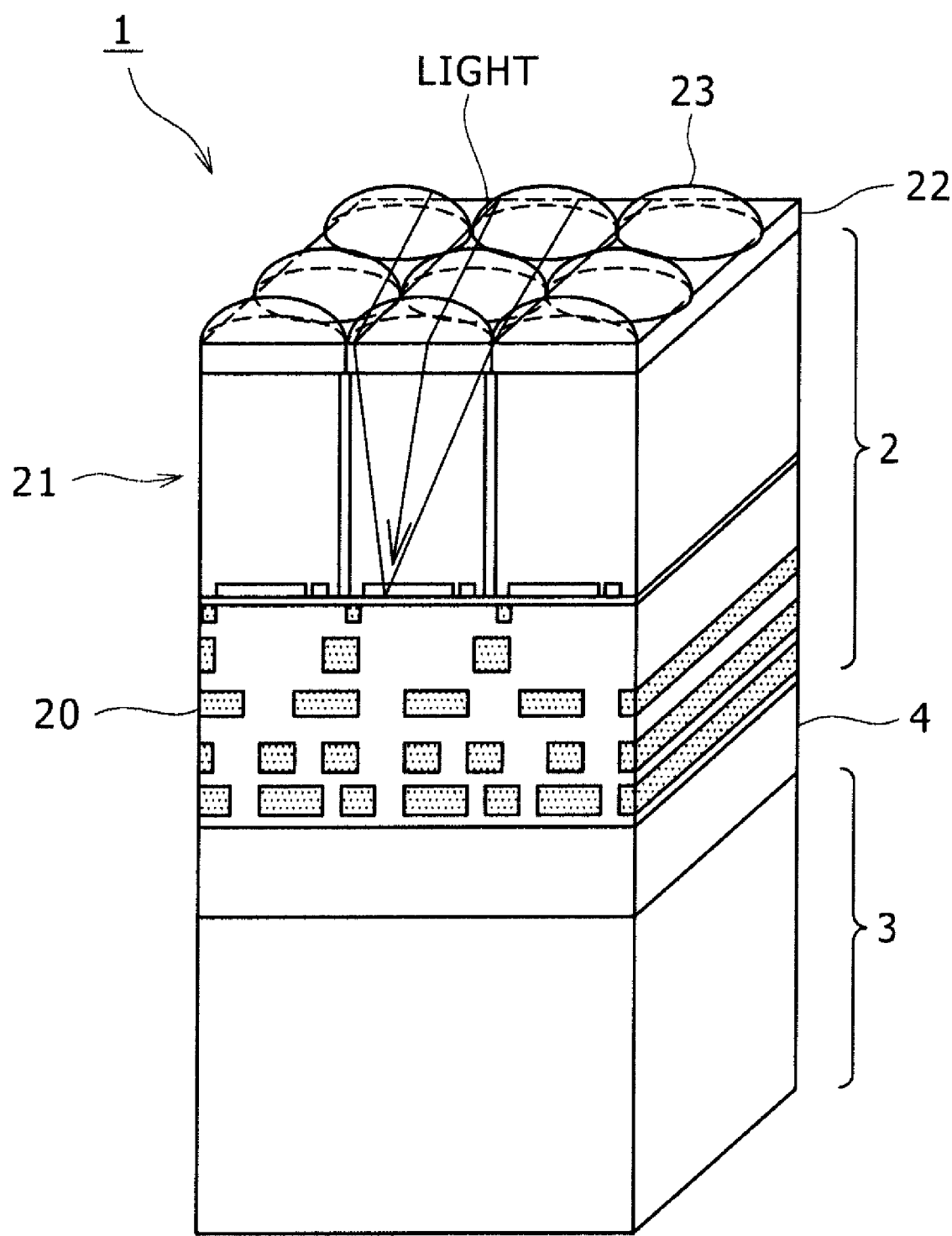
FIG. 1 is a schematic sectional view of assistance in explaining a structure of a CMOS sensor as an example of a solid-state image pickup element according to a present embodiment.

FIG. 1 is a schematic sectional view of assistance in explaining a structure of a CMOS sensor as an example of a solid-state image pickup element according to the present embodiment. Specifically, the solid-state image pickup element 1 includes for example a φ8-inch SOI (Silicon On Insulator) substrate (device substrate) 2 in which a CMOS image sensor 21 is formed and a wiring layer 20 is formed via an insulating layer and a supporting substrate 3 laminated to a surface (front surface) of the device substrate 2 in which surface the wiring layer 20 is formed via an adhesive 4, the supporting substrate 3 being a silicon (Si) substrate of a same size as the device substrate 2. The side of the device substrate 2 is ground and etched in a state of the device substrate 2 and the supporting substrate 3 being laminated to each other, and merely a silicon active layer is left in the device substrate 2 (back surface transfer).

Then, a color filter (OCCF) 22 and an on-chip lens (OCL) 23 are formed on the transferred active layer, thereby a back-surface irradiation type CMOS sensor is completed, which ultimately has a photodiode (FD) located in an upper surface and the wiring layer 20 located in a lower surface.

The present embodiment is defined in that in laminating the device substrate 2 and the supporting substrate 3 to each other in the solid-state image pickup element 1, pattern distortion (distortion in a vertical and a horizontal direction of the CMOS image sensor) at the time of the lamination is suppressed and adhesive film thickness distribution is uniformized by performing temporary bonding at a room temperature or at a temperature in a range of a room temperature to a reflow temperature of the adhesive by applying pressure to the device substrate 2 and the supporting substrate 3 in a state of the device substrate 2 and the supporting substrate 3 being laminated to each other via the adhesive 4 and thereafter curing the adhesive 4 (adhesive curing) after releasing the applied pressure.

The device substrate 2 used in the solid-state image pickup element according to the present embodiment is for example a φ8-inch SOI substrate. Unit pixels each including one photoelectric conversion element (photodiode (FD)) and a plurality of MOS type transistors are formed in the form of a matrix to constitute an image pickup region in the silicon active layer of the SOI substrate.

In addition, a peripheral circuit (not shown) including a CMOS transistor is formed and a pad (not shown) for making wiring to the outside is provided on the periphery of the image pickup region. The MOS type transistors in the unit pixels are formed in the silicon active layer of the SOT substrate, and the CMOS transistor of the peripheral circuit is also formed in the silicon active layer of the SOI substrate.

Multiple layers of the wiring layer 20 are formed via the insulating film on the front surface side (lower side in the figure) of the image pickup region and the peripheral circuit. On the back surface side (upper side in the figure) of the device substrate 2, for example an antireflection film and a planarizing film not shown in the figure are formed via the insulating film, and further the color filter (OCCF) and the on-chip lens (OCL) are formed so as to correspond to the photodiode (FD) of each unit pixel.

The device substrate 2 is laminated to the supporting substrate 3 with the back surface side of the device substrate 2 as the front, the back surface side of the device substrate 2 is ground and etched to expose the silicon active layer in which the photodiode (FD) is formed, and the color filter (OCCF) and the on-chip lens (OCL) are formed so as to correspond to the photodiode (FD) of each unit pixel, thereby light is taken in by the photodiode (FD) via the color filter (OCCF) and the on-chip lens (OCL) disposed on the back surface side of the device substrate 2. Merely the matrix of photodiodes (FD) is exposed on the back surface side of the device substrate 2. It is thus possible to obtain a large light receiving area without being affected by the wiring layer 20 or the like.

In the solid-state image pickup element 1 according to the present embodiment of such a structure, an adhesive is used to laminate the device substrate 2 and the supporting substrate 3 to each other, and a thermosetting resin is applied as the adhesive. In addition, in curing the adhesive by heating in a state of the device substrate 2 and the supporting substrate 3 being laminated to each other via the adhesive, temporary bonding is performed at such a temperature as not to cure the adhesive (at a room temperature or at a temperature in a range of a room temperature to a reflow temperature of the adhesive) in a state of a pressure being applied to both the laminated substrates, and thereafter the adhesive 4 is cured by heating the adhesive 4 to a curing temperature after the applied pressure is released. In this case, the reflow temperature refers to a temperature before the adhesive 4 is cured by heat.

Thus, because the adhesive 4 is yet to be cured when a pressure is applied to both the laminated substrates, film thickness is held uniform while stress due to the application of the pressure is absorbed. Thereafter, the adhesive 4 can be cured by heating in a state of the applied pressure being released, that is, the adhesive can be cured in a condition free from the stress due to the application of the pressure. Therefore distortion in the silicon active layer can be reduced.

Because distortion in the silicon active layer can be reduced at the time of the substrate lamination, it is possible to suppress distortion in a surface direction of the photodiode (FD) formed in the silicon active layer, and perform accurate optical positioning of the color filter (OCCF) and the on-chip lens (OCL) formed so as to correspond to the photodiode (FD).

<Method of Manufacturing Solid-State Image Pickup Element According to Present Embodiment>

Figure 2:
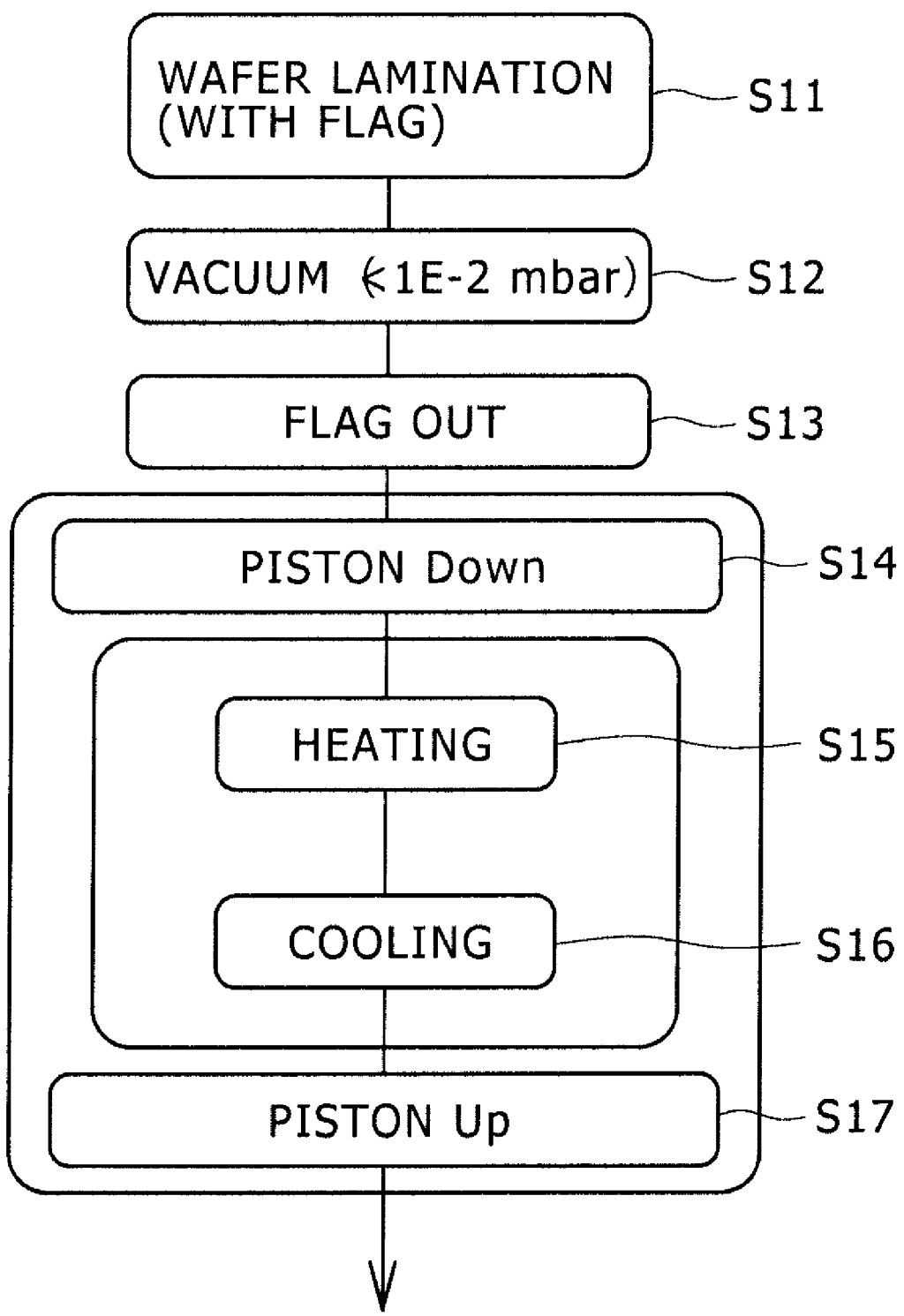
FIG. 2 is a flowchart of assistance in explaining an existing method of laminating a device substrate and a supporting substrate.
Figure 3:
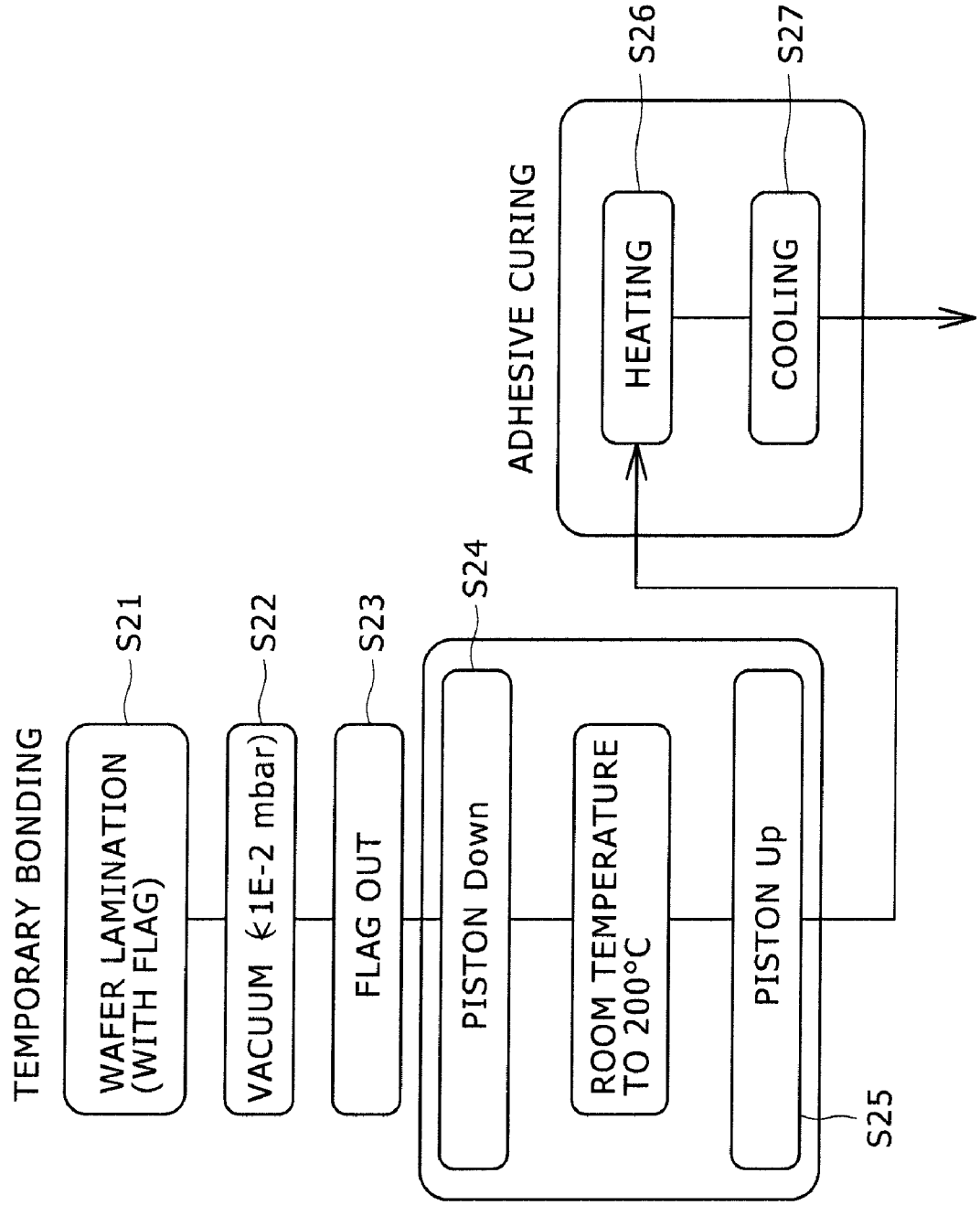
FIG. 3 is a flowchart of assistance in explaining a method of laminating a device substrate and a supporting substrate according to the present embodiment.

A method of manufacturing the solid-state image pickup element according to the present embodiment (a method of laminating the device substrate and the supporting substrate in particular) will next be described by comparison with an existing manufacturing method. FIG. 2 is a flowchart of assistance in explaining an existing method of laminating a device substrate and a supporting substrate. FIG. 3 is a flowchart of assistance in explaining a method of laminating a device substrate and a supporting substrate according to the present embodiment. Incidentally, suppose in both the flowcharts that circuits of photodiodes, transistors and the like described above are already formed in the device substrate.

(Existing Laminating Method)

As shown in FIG. 2, first, the device substrate and the supporting substrate are superimposed on each other via an adhesive (step S11). In this case, for example BCB, which is a thermosetting resin, is used as the adhesive. A film of BCB is formed on a surface of one substrate to be laminated. The device substrate and the supporting substrate are superimposed on each other with a flag interposed therebetween so that the one substrate does not come into contact with the other substrate, and are then set in a chamber.

Next, after the inside of the chamber is decompressed (step S12), the flag interposed between the substrates is extracted, and the device substrate and the supporting substrate are superimposed on each other (step S13). Thereafter the substrates superimposed on each other are sandwiched by a flat chuck from above and from below to apply a predetermined weight (step S14: PISTON DOWN). Then, with the application of the weight, the chuck is heated from a room temperature to a curing temperature of the adhesive (step S15).

The adhesive is cured by raising the temperature, and is then cooled (step S16). After the adhesive is cooled, the weight applied by the chuck is released (step S17: PISTON UP).

Such an existing laminating method cures BCB as the adhesive while holding the device substrate and the supporting substrate in a closely adhering state by performing heating while applying pressure. However, because the laminating method cures the adhesive while applying weight between the substrates, the adhesive is cured under stress of the application of the pressure, and the stress reaches the device substrate. Then, the stress causes pattern distortion of a CMOS image sensor formed in the device substrate.

Laminating Method According to Present Embodiment

Accordingly, in the present embodiment, a method that separates heating and pressurization from each other is applied to suppress pattern distortion occurring at the time of lamination. That is, the present embodiment is defined in that a process of laminating the device substrate and the supporting substrate is divided into two stages, that is, a stage of temporary bonding performed in the vicinity of a room temperature under reduced pressure and an adhesive curing stage in which heating is performed without pressure being applied.

As shown in FIG. 3, first, the device substrate and the supporting substrate are superimposed on each other via an adhesive (step S21). A film of BCB is formed on a surface of one substrate to be laminated. The device substrate and the supporting substrate are superimposed on each other with a flag interposed therebetween so that the one substrate does not come into contact with the other substrate, and are then set in a chamber.

Next, after the inside of the chamber is decompressed (step S22), the flag interposed between the substrates is extracted, and the device substrate and the supporting substrate are superimposed on each other (step S23). A process up to this step is the same as in the existing substrate laminating method represented in FIG. 2.

Next, the substrates superimposed on each other are sandwiched by a flat chuck from above and from below to apply a weight (step S24: PISTON DOWN). At this time, temporary bonding via the adhesive is performed by making the substrates closely adhere to each other through application of pressure with the temperature within the chamber set at a room temperature or at a temperature in a range of a room temperature to a reflow temperature of BCB as the adhesive. At the reflow temperature of the adhesive or lower, the adhesive is not cured yet. The temporary bonding through the application of a weight between the substrates in this state can minimize effect of stress due to the application of the weight from the chuck. At the same time, degradation in uniformity of film thickness of the adhesive can be prevented.

Next, the pressing pressure applied by the chuck is released (step S25: PISTON UP). Thereafter heating is performed to a curing temperature of the adhesive (step S26).

In this heating, the superimposed substrates are not subjected to stress caused by the application of pressure, and thus distortion (pattern distortion) of the silicon active layer (CMOS image sensor) can be reduced by curing the adhesive under this condition.

After the adhesive is cured by raising the temperature, cooling is performed by lowering the temperature from the curing temperature to a temperature of about 100° C. (step S27).

Concrete Example

A concrete example of the laminating method according to the present embodiment will next be described. Incidentally, in this case, suppose that a semiconductor wafer is used as the device substrate and the supporting substrate. Suppose that BCB (Cyclotene produced by The Dow Chemical Company) is used as the adhesive.

First, a film of BCB as the adhesive is formed on a surface of one wafer (substrate A) to be laminated. Next, the substrate A and the supporting substrate (substrate B) to be laminated are superimposed on each other with a flag interposed therebetween so that the substrate A does not come into contact with the substrate B, and are then set in a chamber.

Next, after the inside of the chamber is decompressed ($10^{-2}$ mbar or less), the flag interposed between the wafers (between the substrates A and B) is extracted, and the two wafers are superimposed on each other. The superimposed wafers are sandwiched by a flat chuck from above and from below to perform temporary bonding at a temperature lower than a BCB curing temperature, preferably a temperature in a range of a room temperature to 200° C., and with an applied weight of 1000 N to 7000 N, preferably 5000 N or less.

Next, after the pressing pressure applied by the chuck to the two wafers temporarily bonded to each other is released, heating is performed. A temperature reached at this time is a BCB curing temperature of 200° C. or higher, and is preferably 330° C.

FIG. 4 is a diagram showing a result of substrate laminating conditions according to the present embodiment, distortion, and flatness (LTV: Local Thickness Variation). Of these substrate laminating conditions, laminating conditions according to the present embodiment are indicated by Nos. 1 to 3, and existing laminating conditions are indicated by ref. The laminating conditions shown in FIG. 4 indicate pressure (N) between the substrates at the time of the temporary bonding, temperature (° C.) at the time of the temporary bonding, data (% in surface directions X and Y) on pattern distortion after the curing of the adhesive in respective corresponding conditions, and flatness (film thickness uniformity of the adhesive (BCB)) LTV (μm). In this case, the pattern distortion data is a relative value with the pattern distortion data of the existing laminating method set to 100. Hence, the value is 0% when there is no distortion at all.

As shown in FIG. 4, in any of the conditions of Nos. 1 to 3, the temporary bonding temperature is 50° C., which is the reflow temperature of the adhesive (BCB) or lower, and excellent results of 28% to 51% relative to the existing value are obtained as pattern distortion after the curing of the adhesive.

In addition, the film thickness uniformity of BCB is 0.8 μm or less as flatness LTV. Thus an excellent result is obtained as compared with the existing lamination (1.5 μm as LTV) in which heating and pressurization are performed simultaneously.

EFFECT OF EMBODIMENT

A result of measurement of an amount of pattern distortion after the device substrate is laminated to the supporting substrate by the method according to the present embodiment indicates that, 100 being the distortion of the existing method, wafers with small distortions of 28 to 51 can be manufactured under favorable conditions of the laminating method according to the present embodiment.

Further, because the film thickness of BCB is held uniform, an excellent result of 0.8 μm or less as LTV after lamination can be obtained.

It should be understood by those skilled in the art that various modifications, combinations, sub-combinations and alterations may occur depending on design requirements and other factor in so far as they are within the scope of the appended claims or the equivalents thereof.

What is claimed is:

1. A method of manufacturing a solid-state image pickup element, said method comprising the steps of:

forming a plurality of photoelectric conversion elements having at least a portion thereof formed within a semiconductor substrate;

forming a wiring layer and an insulating film at a surface of said semiconductor substrate in which surface said plurality of photoelectric conversion elements are formed;

laminating a supporting substrate to a surface at which said wiring layer is formed via an adhesive;

applying a mechanical pressure to said semiconductor substrate and said supporting substrate in a state of said semiconductor substrate and said supporting substrate being laminated to each other via said adhesive, wherein the applied mechanical pressure is a force of between 1000 and 7000N and the temperature is maintained to be less than a curing temperature of the adhesive that is applied between the semiconductor substrate and said supporting substrate while applying the mechanical pressure; and removing the mechanical pressure and thereafter curing said adhesive by heating said adhesive to a temperature that is equal to or greater than a curing temperature of said adhesive after releasing the applied mechanical pressure.

2. The method of manufacturing the solid-state image pickup element according to claim 1, wherein the step of applying the pressure to said semiconductor substrate and said supporting substrate in a state of said semiconductor substrate and said supporting substrate being laminated to each other via said adhesive is performed at a room temperature.

3. The method of manufacturing the solid-state image pickup element according to claim 1, wherein the step of applying a pressure to said semiconductor substrate and said supporting substrate in a state of said semiconductor substrate and said supporting substrate being laminated to each other via said adhesive is performed at a temperature in a range of a room temperature to a reflow temperature of said adhesive.

* * * * *